United States Patent [19]

Bertellotti et al.

[11] Patent Number: 4,538,211

[45] Date of Patent: Aug. 27, 1985

[54] PRINTED WIRING BOARD FILE WITH VARIABLE PRINTED WIRING BOARD SPACINGS

[75] Inventors: Ansano Bertellotti, Addison; Anthony Traina, Villa Park, both of Ill.

[73] Assignee: GTE Communication Systems Corporation, Northlake, Ill.

[21] Appl. No.: 639,881

[22] Filed: Aug. 13, 1984

[51] Int. Cl.³ .............................................. H05K 1/14
[52] U.S. Cl. ..................................... 361/415; 211/41; 361/412
[58] Field of Search ................................ 361/390–392, 361/395, 399, 415, 412; 206/328, 332, 334; 339/17 M, 17 LM; 211/41

[56] References Cited

U.S. PATENT DOCUMENTS

| | | | |
|---|---|---|---|
| 3,898,536 | 8/1975 | Wyshak et al. | 211/41 X |
| 4,323,161 | 4/1982 | Marconi | 361/415 X |
| 4,324,330 | 4/1982 | Durney | 206/328 |
| 4,429,937 | 2/1984 | Stockmaster | 361/415 X |

OTHER PUBLICATIONS

Parks et al., "Circuit Board Holder", IBM Technical Disclosure Bulletin, vol. 18, No. 2, pp. 306–307, Jul. 1975.

Primary Examiner—R. R. Kucia
Assistant Examiner—Tarick Basma
Attorney, Agent, or Firm—Robert J. Black; Gregory G. Hendricks

[57] ABSTRACT

A printed wiring board file employing printed wiring board guides positionable within the file at a plurality of first predetermined spacings and further positionable at a plurality of second predetermined spacings in increments different from those of said first showings. A tab at one end and a clip at the other end of each printed wiring board guide permit assembly to support members and further permit the removal of same should it become necessary to reposition printed wiring boards within the file.

11 Claims, 3 Drawing Figures

PRINTED WIRING BOARD FILE WITH VARIABLE PRINTED WIRING BOARD SPACINGS

BACKGROUND OF THE INVENTION (1) Field of the Invention

The present invention relates to printed wiring board files and, more particularly, to a printed wiring board file employing printed wired board guides positionable at variable spacings relative to each other.

(2) Background Art

Printed wiring board files are very well known to those skilled in the art as are many of the considerations relating to their use. In this regard, a common consideration is the efficient use of space when positioning printed wiring boards within a file. It is common in commercially available printed wiring board files, to build in printed wiring board positioning slots at common fixed spacings sized to efficiently permit the mounting of components of a common predetermined standard height on each printed wiring board mounted in the file.

However, from time to time it has been found necessary to utilize printed wiring board mounted components of greater than standard height or alternately, components which require additional cooling. Such components can create problems when positioning printed wiring boards within a file. These problems have been solved by positioning the boards at double board spacings, thereby providing the added clearance required by increased height components or alternately, providing additional air circulation around components requiring increased cooling.

Such an arrangement, while operating generally satisfactorily, has been found to frequently result in the inefficient file space use as a result of doubling the board spacing within a file when a much smaller space increase is actually required.

Accordingly, it is the object of the present invention to provide a new and useful printed wiring board file that provides greater flexibility in the mounting of printed wiring boards than that found in previously utilized designs.

BRIEF SUMMARY OF THE INVENTION

The present invention overcomes the above problems by providing a printed wiring board file which includes printed wiring board guides of a first predetermined width, positionable within the file at a first predetermined minimum spacing relative to each other and further positionable at a plurality of greater spacings relative to each other in increments less than both the first predetermined minimum width and the first predetermined minimum spacing of said printed wiring board guides. The printed wiring board file includes a pair of end panels and at least two support members. Each support member includes a first row of indexing means each spaced apart a predetermined distance from adjacent indexing means and a second row of indexing means each spaced apart a predetermined distance from said adjacent indexing means. The rows of indexing means are parallel to each other and the indexing means of the second row are displaced laterally relative to the indexing means of the first row.

At least two printed wiring board guides are included, each guide including a first and a second engaging means. The said engaging means of the first guide engages a predetermined one of the first indexing means of the first support member, and the second engaging means of the first guide engages a corresponding first indexing means of the second support member. Further, the first engaging means of said second guide engages a predetermined one of the second indexing means of the first support member, and the second engaging means of the second guide engages a corresponding second indexing means of the second support member.

The printed wiring board guide includes a channel that may be of U-shaped cross section, the channel adapted to engage the edge of the printed wiring board guide being guided. The printed wiring board guide may be of metal construction and may include a funnel-shaped card entrance aligned with the channel to aid entry of the printed wiring board into the channel and may further include a flanged base to prevent rocking of the printed wiring board guide relative to the support members. The support member indexing means may be apertures formed in the support members and the engaging means of the printed wiring board guide may be stepped tabs in the first instance and a resilient clip in the second instance.

BRIEF DESCRIPTION OF THE DRAWING

The object and advantages of a printed wiring board file in accordance with the present invention will be apparent from the following description taken in conjunction with the accompanying drawing in which.

DETAILED DESCRIPTION OF THE INVENTION

Figure 1:
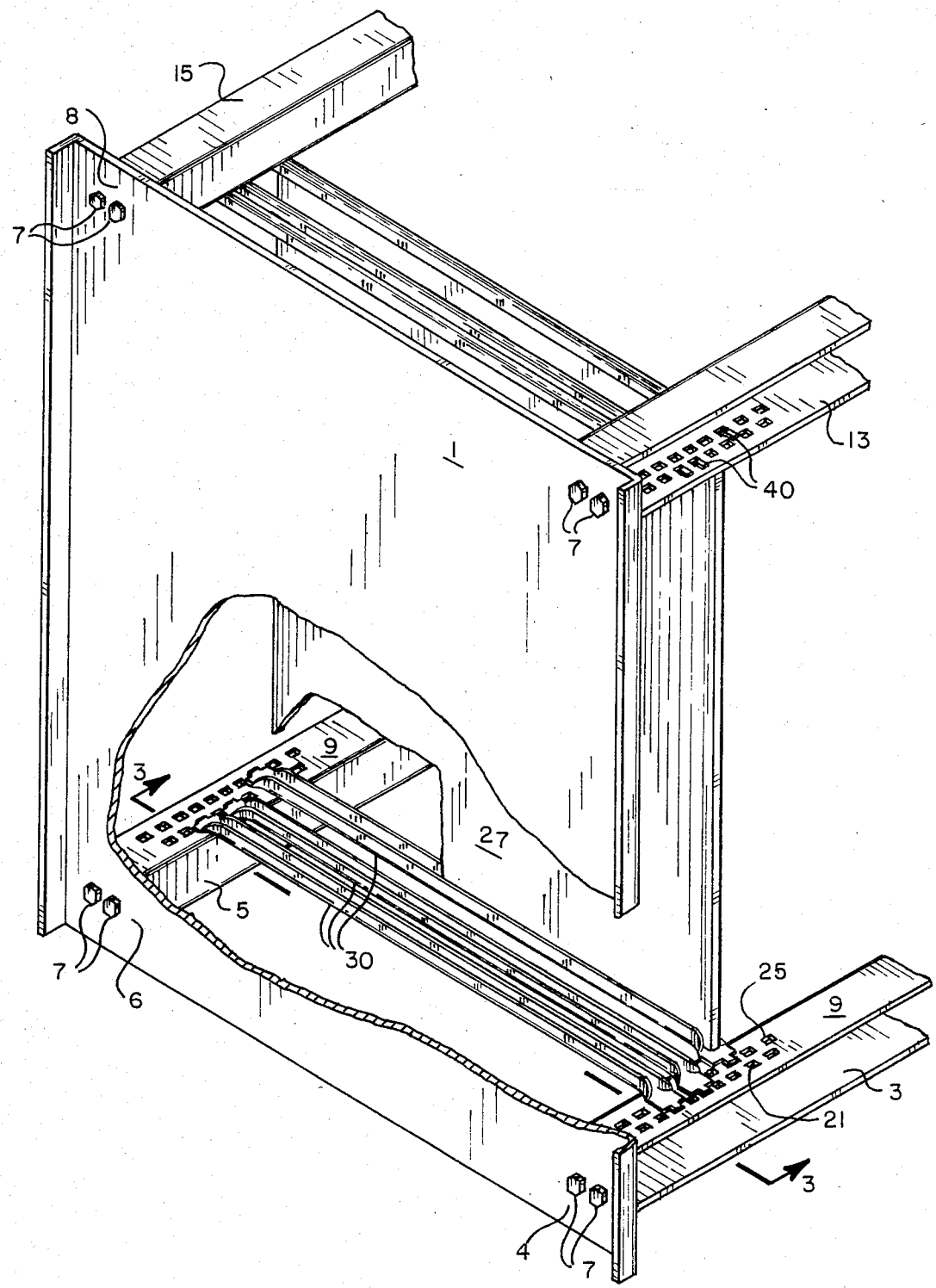
FIG. 1 is a perspective view of the printed wiring board file of the present invention.

Referring now to FIG. 1, there is shown a printed wiring board file including a first end panel 1 and a second end panel 2 (not shown) positioned parallel to the first end panel 1. A front support member 3 is attached between the lower front corner 4 of the first end panel 1 and the corresponding corner of the second end panel 2. A rear support member 5 is similarly attached between the lower rear corner 6 of the first end panel 1 and the corresponding corner of the second end panel 2. The support members 3 and 5 may be attached to the end panels 1 and 2 by any means known to those skilled in the art, as for example by screw fasteners 7. In like manner, an upper front support member 13 may be attached between the upper front corners of the first end panel 1 and the second end panel 2 by means of screw fasteners 7. Finally, an upper rear support member 15 may be attached between the upper rear corner 8 of the first end panel 1 and the corresponding corner of the second end panel 2 by means of screw fasteners 7. The support members 3, 5, 13, and 15 may be of U-shaped cross section including a pair of parallel sides spaced apart by a base portion. The support members may be of metallic construction, and each may include a first row and a second row of apertures formed in an inner side 9 of the support members. The apertures within each row are spaced apart a predetermined distance from each other with the apertures of the second row displaced laterally relative to the apertures of the first row. In this regard, and referring to FIG. 2, there is shown the lower front support member 3 including a first row 20 of indexing apertures 21 and a second row 24 of indexing apertures 25. The second row 24 is parallel to and spaced apart from the first row 20 with the indexing apertures 25 of the second row 24 displaced laterally one-half the distance between the apertures 21 of the first row 20.

Figure 2:
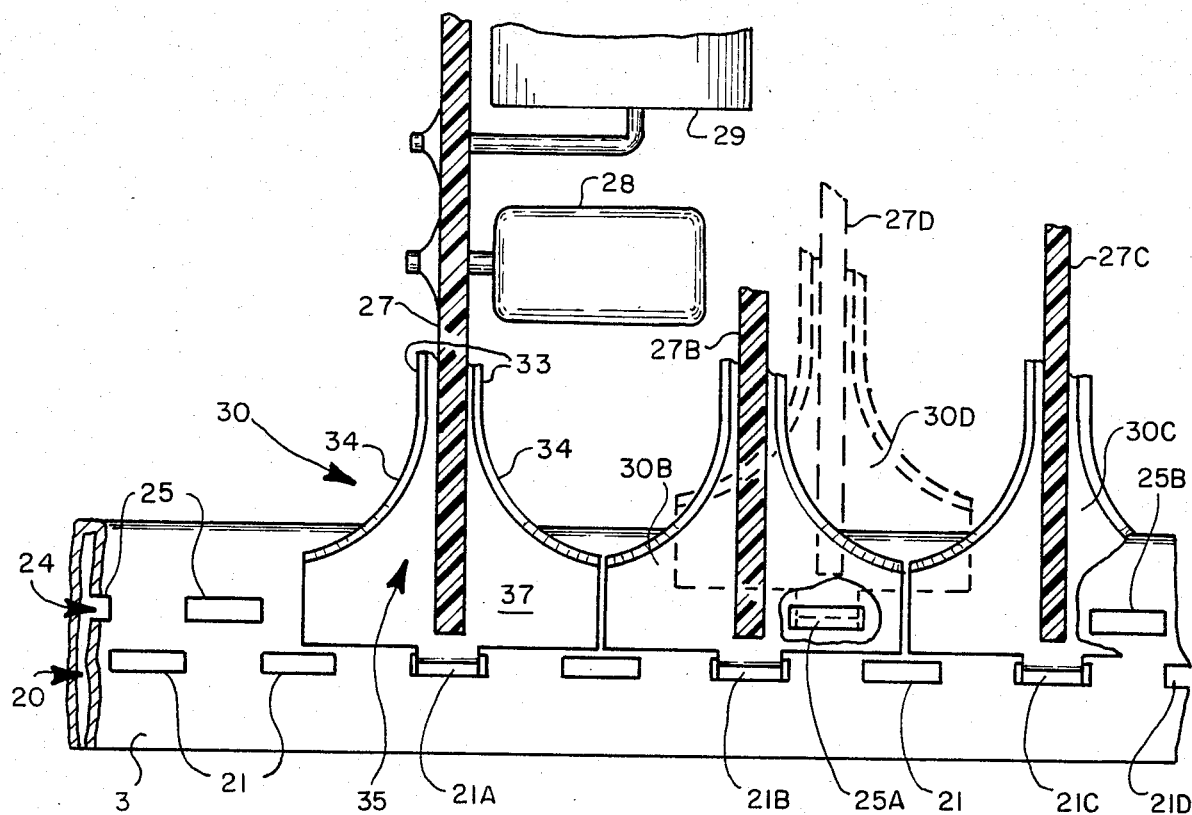
FIG. 2 is a plan view of the present invention.
Figure 3:
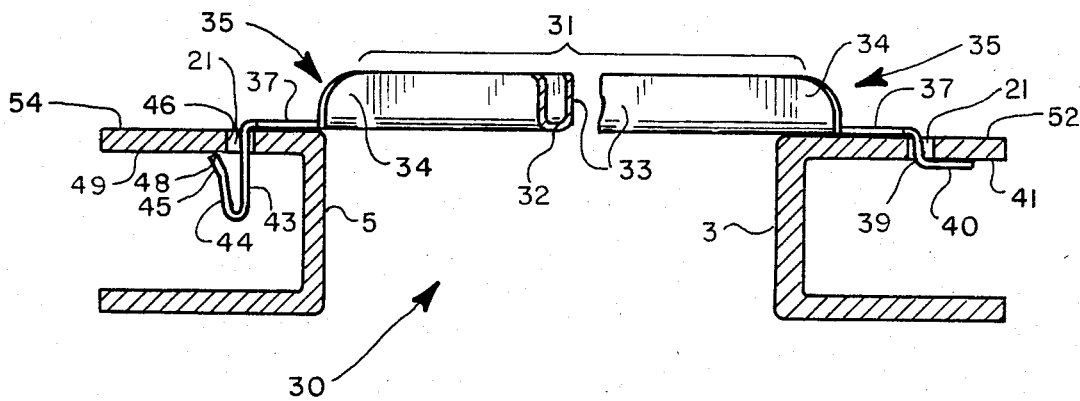
FIG. 3 is a sectional view of the present invention taken along the line 3—3 of FIG. 1.

Referring again to FIG. 1, a plurality of printed wiring boards 27 may be mounted within the printed wiring board file of the present invention on a plurality of printed wiring board guides 30. The guides 30 may mount between the lower support member 3 and 5 or between the upper support members 13 and 15. Referring again to FIG. 2, the printed wiring boards 27 may mount components of a standard height 27 or components of a greater than standard height 28. Referring now to FIG. 3, printed wiring board guide 30 may be of metallic construction and may include body portion 31 having a U-shaped cross section, including a base 32 and a pair of parallel side walls 33, extending perpendicularly therefrom in an upward direction. The side walls 33 of the guide body 31, at each end, are aligned with and join a diverging wall 34, the diverging wall 34 of the printed wiring board guide 30 at each end defining a funnel-shaped card entrance 35. A flanged base 37 is formed at each end of the printed wiring board guide 30 adjacent the diverging walls 34. A stepped tab 39, including a foot 40, is formed at one end of the printed wiring board guide 30. The foot 40 is arranged to engage a lower surface 41 of the support channel 3. A locking clip 43 is formed at the other end of the printed wiring board guide 30. The clip 43 includes an arm 44 attached to the clip at one end and including an angled finger 45 at its distal end. The finger 45 is arranged to engage a wall 46 of the apertures 21 and 25 and the finger 45 includes a latch edge 48, arranged to engage a lower surface 49 of the support member 5.

The printed wiring board guide 30 of the present invention may be operated to engage it with the lower guide supports 3 and 5 by orienting the guide 30 in a vertical orientation with the clip 43 at the guide upper end and the tab 39 at the lower end. The foot 40 of the tab 39 is then engaged with a predetermined one of the apertures of 21 or 25 of the first row 20 or the second row 24 of guide positioning apertures formed in the support member 3. In this regard, the foot 40 is shown, in FIG. 3, engaged with one of the apertures 21 of the first row of apertures 20 of the support member 3. Following engagement of the tab foot 40, with the aperture 21, the printed wiring board guide 30 is pivoted about the aperture 21 to engage the clip 43 within a corresponding one of the guide positioning apertures 21 of the first row 20 of positioning apertures formed in the support member 5. Following engagement of the clip 43 with the aperture 21, force is exerted on the printed wiring board guide 30 in a downward direction to engage the finger 45 with the wall 46 of the apperture 21. The continued application of force to the printed wiring board guide 30 will deflect the arm 44 and the finger 45 in a direction towards the printed wiring board guide 30, permitting the clip to pass through the aperture 21 and the engaging edge 48 of the finger 45 to engage the lower surface 49 of the support member 5, thereby locking the printed wiring board guide in position. The printed wiring board guide 30 is prevented from rocking in its locked position by action of the flanged bases 37 at either end of the guide 30, acting against an upper surface 52 of the support member 3 and an upper surface 54 of the support member 5. A corresponding printed wiring board guide 30 may be similarly attached to the upper support members 13 and 15.

Printed wiring board guides of the present invention may be advantageously attached to the support members to minimize unused file space when printed wiring boards mounting components of standard height and greater than standard height are to be mounted within the same printed wiring board file. In this regard, and referring to FIG. 2, there is shown a printed wiring board 27 mounting components 28 of standard height and optionally, components 29 of greater than standard height. Maximum packing density is achieved when only components of standard height 28 are mounted on the printed wiring board 27 by positioning the printed wiring board guides within the file at a predetermined minimum spacing. Referring now to FIG. 2, a first printed wiring board guide 30 may be positioned within a predetermined aperture 21A of the first row of positioning apertures 20. This guide will position the printed wiring board 27, including only the components 28 of standard height. A next adjacent printed wiring board guide 30B may then be positioned within an aperture 21B of the first row of positioning apertures 20, thereby positioning a second printed wiring board 27B, also mounting components of standard height 28, at a spacing distant enough to avoid contact with the components of standard height 28 of the first printed wiring board 27, yet close enough to maximize the printed wiring board packing density within the file. Similarly, a third printed wiring board 27C may be positioned adjacent to the second printed wiring board 27B by positioning an associated printed wiring board guide 30C within an aperture 21C of the first row of positioning apertures 20.

It is known in the art to skip every second position when components of greater than standard height are mounted on printed wiring boards. In this regard, when the components of greater than standard height 29 are mounted on the printed wiring board 27, it is known to skip the next position of printed wiring 27B as shown in FIG. 2, and to position the next adjacent second printed wiring board in the position of printed wiring board 27C. This arrangement, while operating satisfactorily, results in an excess of unusable space between adjacent printed wiring boards of nearly the size required for an entire printed wiring board.

The present invention permits recovery of such excess space by permitting the second printed wiring board guide to be positioned distant enough from the first printed wiring board guide to prevent contact with the excess height components yet close enough to avoid leaving a significant amount of unusable space between the printed wiring boards. This is accomplished by omitting the guide 30B and substituting therefor a second printed wiring board guide 30D (shown in phantom line). In this regard, the printed wiring board guide 30D is engaged with an aperture 25A of the second row of positioning apertures 24. The guide 30D may mount a printed wiring board 27D. In the event the second printed wiring board 27D is arranged to mount components 28 of standard height, a third printed wiring board guide (not shown) would be positioned within an apperture 25B of the second row of positioning appertures 24. If, on the other hand, the second printed wiring board 27D is arranged to mount components 29 of greater than standard height, a third printed wiring board guide (not shown) would be positioned within an apperture 21D of the first row of positioning apertures 20.

It has been found necessary, from time to time, and as a result of modification and change in circuitry mounted on printed wiring boards, to reposition the boards within a file. In this regard, and referring to FIG. 3, the printed wiring board guide 30 of the present invention may be released from engagement with its associated support members 3 and 5 by applying force to the arm 44 of the clip 43 in a direction towards the tab 39 to deflect the arm 44 and disengage the locking edge 48 from the lower surface 49 of the support member 5. Following disengagement of the locking edge 48 from the lower surface 49, force is applied to the locking clip 43 in an upward direction to pivot the printed wiring board guide 30 about the tab 39 and remove the locking clip 43 from engagement with the aperture 25. The printed wiring board guide 30 is then pivoted about the tab 39 to a nearly vertical orientation whereat the foot 40 may be removed from the aperture 21 of the support member 3. The removed printed wiring board guide may then be repositioned within a corresponding pair of apertures, best positioned to mount a modified printed wiring board configuration.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A file for a printed wiring board employing printed wiring board guides positionable within said file, said file comprising:
   first and second end panels;
   at least first and second support members, each attached to said first and said second end panels, and each including
   a row of first indexing means, each of said first indexing means spaced apart a predetermined distance from adjacent ones of said first indexing means,
   a row of second indexing means, each of said second indexing means spaced a predetermined distance from adjacent ones of said second indexing means, said rows parallel to each other with said second indexing means displaced laterally relative to said first indexing means;
   at least first and second printed wiring board guides, each including first and second engaging means, said first engaging means of said first guide engaging only a predetermined one of said first indexing means of said first support member, and said second engaging means of said first guide engaging only a corresponding first indexing means of said second support member, said first engaging means of said second guide engaging only a predetermined one of said second indexing means of said first support member, and said second engaging means of said second guide engaging only a corresponding second indexing means of said second support member;
   whereby said first and second board guides are positioned within said file and spaced a predetermined distance from each other, said spacing being an alternative to that available if said engaging means of both of said guides are engaged, only with selected ones of said first indexing means or alternately, both of said guides are engaged only with selected ones of said second indexing means 2. A file as claimed in claim 1 wherein: said guides are of metal construction.

3. A file as claimed in claim 1 wherein: said printed wiring board guides each include at least one flanged base, said base engaging a respective one of said support members to stabilize said printed wiring board guide relative to said support members and prevent rocking thereof.

4. A file as claimed in claim 1 wherein: said support member first and second indexing means each consist of an aperture formed in said support member.

5. A file as claimed in claim 1 wherein: said engaging means includes a stepped tab formed at a first end of said printed wiring board guide.

6. A file as claimed in claim 5 wherein: said engaging means further includes a resilient clip formed at a second end of said printed wiring board guide.

7. A file as claimed in claim 1, wherein: said first indexing means predetermined spacing is equal to said second indexing means predetermined spacing.

8. A file as claimed in claim 7, wherein: said second indexing means is displaced laterally relative to said first indexing means a distance equal to one-half of said predetermined spacing of said first indexing means.

9. A file as claimed in claim 4, wherein: said apertures of said first and second indexing means are each of identical shape.

10. A file as claimed in claim 9, wherein: eaoh of said apertures is of rectangular cross-section.

11. A file as claimed in claim 1, wherein: said file further includes at least third and fourth support members, each attached to said first and said second end panels; and third and fourth printed wiring board guides; said first through fourth support members each of identical construction, said first through fourth printed wiring board guides each of identical construction, said support members all positioned parallel relative to each other with corresponding ones of said indexing means of said first and said third support members perpendicularly opposite each other and corresponding ones of said indexing means of said second and said fourth support members perpendicularly opposite each other, and said third and said fourth printed wiring board guides engaged with engaging means perpendicularly opposite engaging means engaged by said first and said second printed wiring board guides respectively.

* * * * *